US011589472B2

(12) United States Patent
Fujioka et al.

(10) Patent No.: US 11,589,472 B2
(45) Date of Patent: Feb. 21, 2023

(54) CASE HAVING INNER SPACE WITHIN COVER FOR ELECTRONIC DEVICE

(71) Applicant: TORAY INDUSTRIES, INC., Tokyo (JP)

(72) Inventors: Takashi Fujioka, Iyo-gun (JP); Masato Honma, Iyo-gun (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 16/309,345

(22) PCT Filed: Jun. 20, 2017

(86) PCT No.: PCT/JP2017/022644
§ 371 (c)(1),
(2) Date: Dec. 12, 2018

(87) PCT Pub. No.: WO2017/221921
PCT Pub. Date: Dec. 28, 2017

(65) Prior Publication Data
US 2019/0313542 A1  Oct. 10, 2019

(30) Foreign Application Priority Data

Jun. 23, 2016  (JP) .............................. JP2016-124181

(51) Int. Cl.
*H05K 5/03* (2006.01)
*H05K 1/18* (2006.01)
(Continued)

(52) U.S. Cl.
CPC ................. *H05K 5/03* (2013.01); *H05K 1/02* (2013.01); *H05K 1/18* (2013.01); *H05K 1/185* (2013.01);
(Continued)

(58) Field of Classification Search
CPC .. H05K 5/03; H05K 5/02; H05K 7/06; H05K 7/04
See application file for complete search history.

(56) References Cited

U.S. PATENT DOCUMENTS 6,183,874 B1 * 2/2001 Yamagata ........... C22C 32/0063
428/472
6,974,620 B1 * 12/2005 Tsunekawa .............. H01G 4/20
428/141
(Continued)

FOREIGN PATENT DOCUMENTS

JP      2004-111502 A    4/2004
JP      2009-130283 A    6/2009
(Continued)

OTHER PUBLICATIONS

International Search Report, issued in PCT/JP2017/022644, PCT/ISA/210, dated Sep. 19, 2017.
(Continued)

*Primary Examiner* — Rockshana D Chowdhury
*Assistant Examiner* — Douglas R Burtner
(74) *Attorney, Agent, or Firm* — Birch, Stewart, Kolasch & Birch, LLP

(57) ABSTRACT

A case which is configured of a cover comprising an electronic device, and which is characterized in that the electronic device is inserted into the cover. A case which is configured of a cover comprising an electronic device, and which has an improved storage capacity, while maintaining the stiffness required for a case.

6 Claims, 4 Drawing Sheets

(51) Int. Cl.
| | |
|---|---|
| *H05K 3/30* | (2006.01) |
| *H05K 9/00* | (2006.01) |
| *H05K 7/06* | (2006.01) |
| *H05K 1/02* | (2006.01) |
| *H05K 5/02* | (2006.01) |

(52) U.S. Cl.
CPC ............... *H05K 3/30* (2013.01); *H05K 5/02* (2013.01); *H05K 7/06* (2013.01); *H05K 9/00* (2013.01); *H05K 9/0007* (2013.01); *H05K 2201/0999* (2013.01); *H05K 2203/1305* (2013.01)

(56) References Cited

U.S. PATENT DOCUMENTS

| | | | | |
|---|---|---|---|---|
| 7,391,378 | B2* | 6/2008 | Mikkola | H01Q 1/243 343/702 |
| 7,486,243 | B2* | 2/2009 | Wulff | B29C 45/14639 343/702 |
| 7,934,676 | B2* | 5/2011 | Dufresne | B64D 45/02 244/1 A |
| 9,101,082 | B1* | 8/2015 | Dorenkamp | H05K 5/03 |
| 9,894,789 | B1* | 2/2018 | Hamada | B32B 38/0004 |
| 10,544,274 | B2* | 1/2020 | Kurokawa | B32B 5/26 |
| 10,927,226 | B2* | 2/2021 | Suzuki | B32B 27/38 |
| 11,352,472 | B2* | 6/2022 | Kurokawa | C08J 5/248 |
| 2004/0018863 | A1* | 1/2004 | Engstrom | G06F 21/31 455/575.8 |
| 2004/0084759 | A1* | 5/2004 | Miyagawa | H01L 25/065 257/678 |
| 2008/0295955 | A1* | 12/2008 | Cawse | H05F 3/02 428/411.1 |
| 2009/0015490 | A1* | 1/2009 | Honda | H01Q 9/42 343/702 |
| 2009/0015507 | A1* | 1/2009 | Hong | H01Q 9/0407 343/873 |
| 2009/0051616 | A1* | 2/2009 | Hong | H01Q 1/1207 343/872 |
| 2009/0115669 | A1* | 5/2009 | Cheng | H01Q 1/243 343/702 |
| 2009/0267266 | A1* | 10/2009 | Lee | G06F 1/181 264/272.11 |
| 2009/0322629 | A1* | 12/2009 | Hung | B29C 45/14065 343/702 |
| 2010/0039347 | A1* | 2/2010 | Chen | B29C 45/14065 343/873 |
| 2010/0178487 | A1* | 7/2010 | Arai | D06M 11/83 428/300.1 |
| 2011/0222219 | A1* | 9/2011 | Bae | H01Q 1/243 361/679.01 |
| 2012/0039050 | A1* | 2/2012 | Chang | B29C 45/1671 361/749 |
| 2013/0088128 | A1* | 4/2013 | Nakano | H05K 7/2039 310/68 R |
| 2013/0148314 | A1* | 6/2013 | Hirai | H05K 7/06 361/748 |
| 2013/0190052 | A1* | 7/2013 | Lundell | H04M 1/0262 455/566 |
| 2013/0242487 | A1 | 9/2013 | Fujioka et al. | |
| 2013/0273295 | A1* | 10/2013 | Kenney | B32B 27/40 428/67 |
| 2014/0014403 | A1* | 1/2014 | Miller | H05K 1/0281 174/260 |
| 2014/0192493 | A1* | 7/2014 | Lerenthal | G06F 1/1635 361/752 |
| 2014/0267990 | A1* | 9/2014 | Moon | G06F 1/1605 349/122 |
| 2015/0062845 | A1* | 3/2015 | Akashi | H05K 7/04 361/753 |
| 2015/0184333 | A1* | 7/2015 | Arai | D06M 15/55 428/327 |
| 2015/0274911 | A1* | 10/2015 | Suzuki | B32B 27/38 156/60 |
| 2015/0289425 | A1* | 10/2015 | Yoshida | B32B 5/26 428/113 |
| 2015/0295615 | A1* | 10/2015 | Smith | B32B 37/182 455/575.8 |
| 2016/0301150 | A1* | 10/2016 | Choi | H05K 1/148 |
| 2017/0034932 | A1* | 2/2017 | Rostami | H05K 5/0247 |
| 2017/0091492 | A1* | 3/2017 | Brodsky | H01R 12/59 |
| 2017/0099742 | A1* | 4/2017 | Choi | H05K 5/03 |
| 2017/0111994 | A1* | 4/2017 | Bedjaoui | H05K 3/4038 |
| 2017/0142830 | A1* | 5/2017 | Kreutzwiesner | H05K 1/0209 |
| 2017/0184764 | A1* | 6/2017 | Matsuyuki | H05K 5/0017 |
| 2018/0103555 | A1* | 4/2018 | Terenzio | H01R 12/721 |
| 2018/0208729 | A1* | 7/2018 | Kurokawa | C08J 5/24 |
| 2019/0064885 | A1* | 2/2019 | Paik | G06F 1/1632 |
| 2019/0097301 | A1* | 3/2019 | Wu | H01Q 1/421 |
| 2019/0150308 | A1* | 5/2019 | Takahashi | H05K 5/03 361/679.01 |
| 2019/0274225 | A1* | 9/2019 | Takahashi | H05K 5/02 |
| 2022/0055324 | A1* | 2/2022 | Hebert | B32B 7/025 |

FOREIGN PATENT DOCUMENTS

| | | |
|---|---|---|
| JP | 2012-44640 A | 3/2012 |
| JP | 2012-183820 A | 9/2012 |
| JP | 2014-8956 A | 1/2014 |
| JP | 2014-239106 A | 12/2014 |
| JP | 2015-230255 A | 12/2015 |

OTHER PUBLICATIONS

Written Opinion of the International Searching Authority, issued in PCT/JP2017/022644, PCT/ISA/237, dated Sep. 19, 2017.

English translation of the Japanese Office Action for Japanese Application No. 2017-548306, dated Jun. 22, 2021.

English translation of Japanese Office Action for corresponding Japanese Application No. 2017-548306, dated Jan. 18, 2022.

\* cited by examiner (a)

(b)

CASE HAVING INNER SPACE WITHIN COVER FOR ELECTRONIC DEVICE

TECHNICAL FIELD

The present invention relates to a case for housing machines, electronic components, or the like.

BACKGROUND ART

In recent years, development of smaller-size products such as appliances and electric/electronic devices is performed actively from the viewpoint of realizing effective use of living space and providing instruments with improved portability. More specifically, they are intended for space saving through miniaturization and optimized design of machines and electronic components (such as circuit boards) housed in cases. In addition, it is also mentioned that they use more rigid case materials that serve to provide thin-wall cases to realize an increased storage capacity inside the cases. Against such a background, many techniques intended for miniaturization of electronic components and optimized design of cases have been proposed.

Specifically, Patent Document 1 describes an invention of a circuit board produced by a process in which thin metal plates having circuit patterns are integrated by insert-molding with synthetic resin. Patent Document 2 describes an invention of a case for an electronic device in which the position of its flexible substrate is specified.

PRIOR ART DOCUMENTS

Patent Documents

Patent Document 1: Japanese Unexamined Patent Publication (Kokai) No. HEI 3-240300
Patent Document 2: Japanese Unexamined Patent Publication (Kokai) No. HEI 9-172287

SUMMARY OF INVENTION

Problems to be Solved by the Invention

In the invention described in Patent Document 1, however, the thin metal plates are covered with an insulating film or an insulating layer and molded together with conductive resin. Although this may be effective for miniaturization and design optimization of electronic components, it will be impossible to produce a large-sized case by using thin metal plates. In the invention described in Patent Document 2, a flexible printed circuit board is disposed on the inner surface of the case body to serve as a structural member for electromagnetic shielding. As a result, this may be effective for maintaining the electromagnetic wave shielding capability even if the outer surface is damaged, but it is necessary to form bosses and ribs for supporting the flexible substrate, which will prevent the realization of miniaturization and saving of space.

As described above, the conventional techniques for the miniaturization of products such as appliances and electric/electronic devices will not serve for effective utilization of the spaces in cases. Thus, there has been a strong call for the development of a technique that serves for producing a case having an increased storage capacity while maintaining a high stiffness required to work as a tough case.

The present invention has been made in view of the above problems and aims to provide a case having an increased storage capacity while maintaining a high stiffness required to work as a tough case.

Means of Solving the Problems

The present invention, which aims for solving the above problems, is as described below.
(1) A case comprising a cover having an electronic device, the electronic device being inserted inside the cover.
(2) The case as set forth in item (1), wherein the cover has at least a flat member and the electronic device is inserted at least inside the flat member of the cover.
(3) The case as set forth in either item (1) or (2) having a space for containing an electronic component.
(4) The case as set forth in any one of items (1) to (3), wherein at least part of the cover is made of an electrically conductive material.
(5) The case as set forth in any one of items (1) to (3), wherein at least part of the cover is made of a nonconductive material.
(6) The case as set forth in any one of items (1) to (5), wherein the cover has a mechanism connectable to the electronic device.
(7) The case as set forth in any one of items (1) to (6), wherein the upright wall member of the cover is made of the same material as the flat member of the cover.
(8) A production method for the case containing the cover having the electronic device in such a manner that the electronic device is inserted in the cover, comprising: a step in which an electronic device and at least one material selected from the group consisting of prepreg, film, and nonwoven fabric are stacked in such a manner that the electronic device is located on the inner side to form a preform, and a step in which compression and/or reduced pressure is applied to shape the preform.

Advantageous Effects of the Invention

The case according to the present invention realizes an increased storage capacity inside thereof while maintaining a high rigidity required to work as a tough case.

DESCRIPTION OF PREFERRED EMBODIMENTS

As a result of intensive studies, the inventors of the present invention found that if an electronic device is inserted in the cover used to form a case, it becomes possible to produce a case having an increased storage capacity, compared to cases having a cover without an electronic device, while maintaining a high rigidity required to work as a tough case. The case according to the present invention is described in more detail below with reference to drawings. Applications of the case according to the present invention include cases for electric and electronic devices, office automation instruments, household electrical appliances, medical instruments, etc., as well as carrying cases for transportation, and the like, and in particular, it is applied suitably to portable devices such as clamshell type notebook computers, tablet type notebook computers, mobile phones, and medical cassettes.

The present invention provides a case comprising a cover having an electronic device, the electronic device being inserted inside the cover. The case according to the present invention is described in detail below.

<Electronic Device>

The electronic device used for the present invention is an element that draws on the function of electrons to perform active work such as amplification and it may be a transistor, electronic tube, or the like. Furthermore, the electronic device may be a resistor such as IC (integrated circuit) or an element containing a passive component such as capacitor, inductor and transformer, and may also be an electronic circuit, antenna, sensor, or printed circuit board that has a CPU (central processing unit) or an AI (artificial intelligence) function. Relays and connectors used to link them may also be included in electronic device. For the present invention, these electronic devices may be used singly, or two or more thereof may be used in combination. There are no specific limitations on the thickness of these electronic devices, but their thickness is preferably 1 mm or less, more preferably 0.5 mm or less, and still more preferably 0.3 mm or less. This makes it possible to decrease the thickness of the cover contained in the case, thereby serving to meet the requirement for reduction in the overall thickness and weight of the case.

Figure 1:
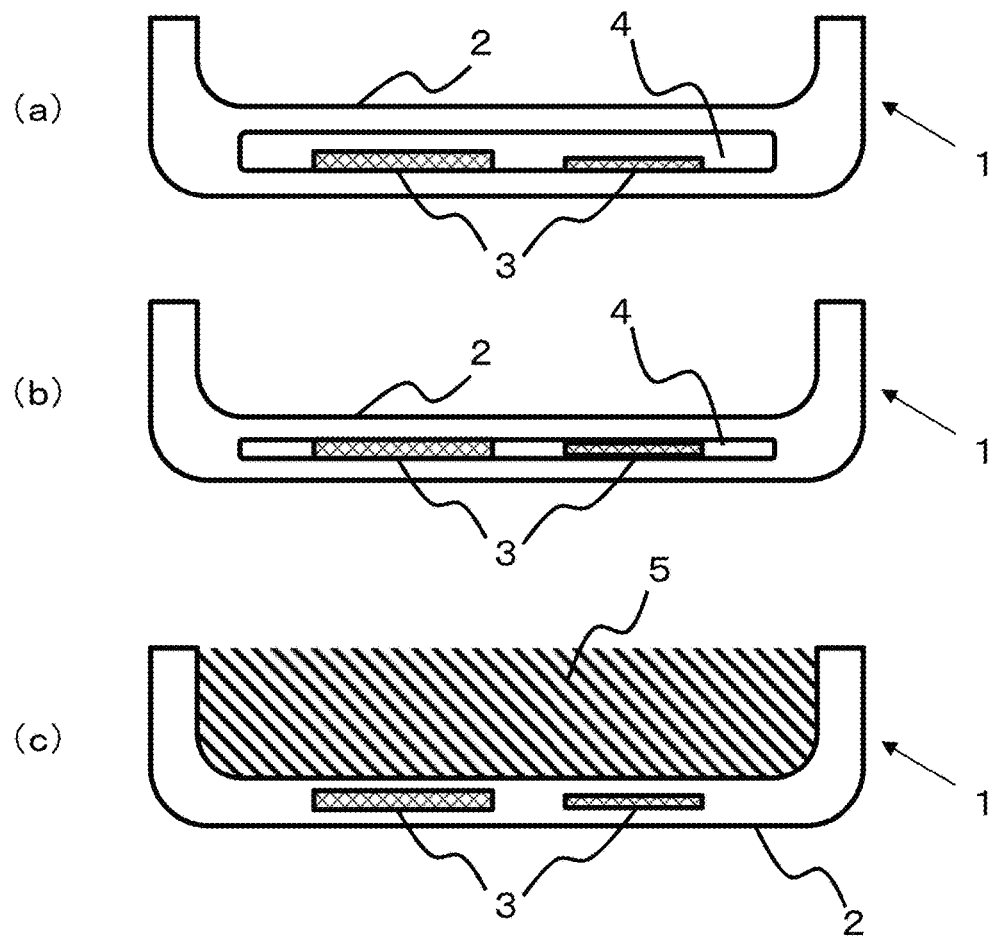
FIG. 1 is a schematic cross-sectional view for illustrating the case according to the present invention.

It is necessary for these electronic devices to be inserted in the cover contained in the case. The state of electronic devices being "inserted in the cover" means that as illustrated in FIG. 1($a$), the electronic devices are sealed as a result of being covered by the material that constitutes the cover, allowing the electronic devices to be located in the space formed within the material that constitutes the cover. In this instance, it is preferable that at least the top and bottom surfaces of each electronic device are in contact with the material that constitutes the cover as illustrated in FIG. 1($b$), and it is more preferable that the entirety (all surfaces) of each electronic device is in contact with the material that constitutes the cover as illustrated in FIG. 1($c$). If the electronic devices are inserted in the cover as described above, it will be unnecessary, as shown in FIG. 1($c$), for the electronic devices to be located at a position which is outside the cover and inside the inner space 5 of the case, serving to enlarge the internal space of the case and ensure an increased storage capacity of the case. In addition, as the electronic devices are inserted in the cover, the electronic devices can be protected from penetration of water, serving to provide highly waterproof cases. It would be difficult to remove the electronic device, furthermore, to ensure increased security.

A cover containing inserted electronic devices can be produced by printing these electronic devices or circuits that constitute part thereof directly on the material that constitutes the inner wall of the cover. In this instance, if they are printed directly on the film, nonwoven fabric, or prepreg that are used as material of the cover, it eliminates the necessity of substrates that work as the bases of the electronic devices, thereby contributing to reduction in the weight of the case and the wall thickness of the cover.

For the present invention, it is preferable that each electronic device is inserted at least in the flat member of the cover as illustrated in FIG. 1. This arrangement ensures an increased degree of design freedom. The flat members referred to above are the smooth-faced parts, other than the curved parts such as corners, of the case. Here, there are no specific limitations on the position into which the electronic device is inserted. With respect to the thickness-directional position, however, it is preferably located at a position near the through-thickness center of the cover to ensure smaller liability to deformation and impact caused by external forces. With respect to the plane direction, it is preferably located at a position near an upright wall or reinforcing member of the case from the viewpoint of the protection of the electronic device.

<Cover>

The cover used for the present invention is one of the constituents of a case. An embodiment in which the case is constituted only of a cover is preferred from the viewpoint of productivity improvement because its production does not require a molding step. On the other hand, an embodiment in which the case is constituted of a combination of a cover and other members is preferred from the viewpoint of increasing the degree of design freedom for shape or the like. Using this cover and/or a combination of a cover and other members, a case as illustrated in FIGS. 1 to 4 is fabricated while inserting electronic devices to ensure their fixing and protection, which is the major object. Depending on design purposes, materials useful for the cover include thermosetting resins, thermoplastic resins, fiber reinforced resins produced by adding reinforcement fiber to the former resins, and metals. The use of a resin with a low specific gravity is preferred from the viewpoint of reducing the weight of the case whereas the use of a fiber reinforced resin or a metal is preferred from the viewpoint of increasing the rigidity. These materials used to constitute the cover may be used singly, or two or more thereof may be used in combination.

The material used to form a cover containing inserted electronic device is preferably in the form of film or nonwoven fabric in order to ensure high material handleability and easy preform preparation. Among other types of films, prepreg plates composed mainly of reinforcement fiber impregnated beforehand with resin are preferred from the viewpoint of providing a cover with improved mechanical characteristics.

Figure 2:
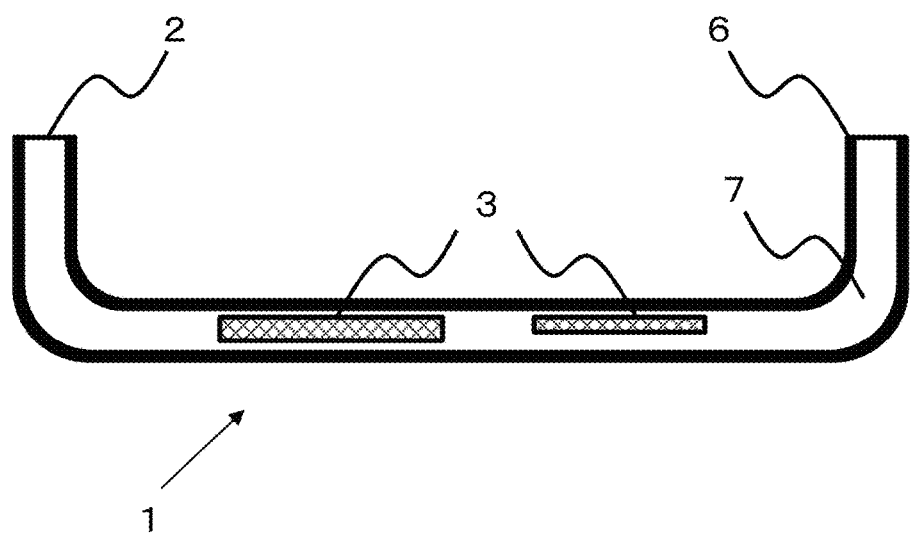
FIG. 2 is a schematic cross-sectional view illustrating the case according to the present invention having a cover with a surface of an electrically conductive material.

It is preferable for the cover used for the present invention to be formed at least partly of an electrically conductive material. If an electrically conductive material is used at least as part of the cover, it serves to allow the cover to have electromagnetic wave shielding capability. The term "electrically conductive material" used herein refers to a material having a volume resistivity value of less than $1.0 \times 10^{-2}$ $\Omega \cdot$cm. Such electrically conductive materials include, for example, fiber reinforced resins containing carbon fiber or metal fiber, and metals. There are no specific limitations on the position of the electrically conductive material as long as it exists at least as part of the cover. Therefore, electrically conductive material may, for example, be arranged selectively in the cover at positions where shielding of electromagnetic waves is required, but from the viewpoint of achieving a high productivity, it is preferable to adopt a sandwich structure as illustrated in FIG. 2 in which electrically conductive material is arranged over the surfaces of the cover. Furthermore, since electrically conductive material tends to be high in heat conductivity, it is preferably located near electronic devices that require heat radiation, cooling fans, or the like.

It is preferable for the cover used for the present invention to be formed at least partly of a nonconductive material. If a nonconductive material is used at least as part of the cover, a case containing the cover will be able to transmit radio waves. The term "nonconductive material" used herein refers to a material having a volume resistivity value of $1.0 \times 10^{-2}$ Ω·cm or more. Such nonconductive materials include, for example, fiber reinforced resins containing glass fiber or aramid fiber, resins, and ceramics. There are no specific limitations on the position of the nonconductive material as long as it exists at least as part of the cover. Therefore, it is preferably located, for example, around the position in the cover where an antenna is inserted.

Figure 3:
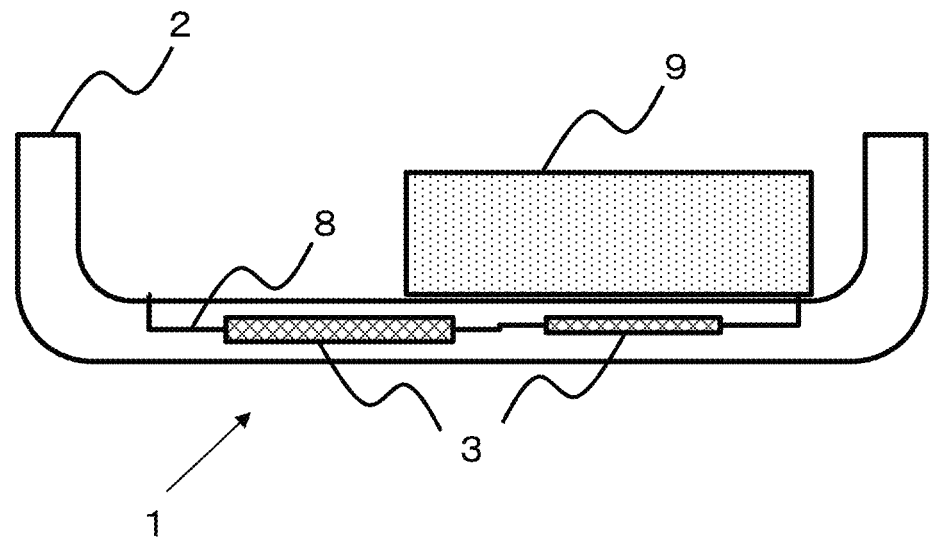
FIG. 3 is a schematic cross-sectional view illustrating the case according to the present invention having a mechanism connectable to an electronic device.

The cover used for the present invention preferably has a mechanism that serves for connection with an electronic device as illustrated in FIG. 3. The mechanism that serves for connection with an electronic device may be located on the side where the cover and the electronic components of the case are disposed or on the side opposite thereto. In the case where an electronic device such as battery is provided in the inner space of the cover or case, for example, a mechanism connectable to the electronic device is preferably disposed inside the cover. On the other hand, in the case where it is connected with an external unit such as electronic device located outside the case, a mechanism connectable to the electronic device is preferably disposed outside the cover.

For the present invention, there are no specific limitations on the means to be used to produce a cover that contains an electronic device, and useful ones include a method in which a preform containing an electronic device is subjected to press molding or autoclave molding, a method in which an electronic device is placed in a die and subjected to insert injection molding, a method in which an electronic device coated with resin is exposed to light with a specific wavelength to cure and mold the resin, and a method in which an electronic device is embedded in a cover containing a groove designed for insertion of the electronic device and subjected to molding after fitting a lid.

The cover used for the present invention preferably has an upright member and a flat member that are formed of the same material as illustrated in FIG. 1. The expression "being formed of the same material" means that, of the components contained in the materials constituting the different parts, the same component accounts for 50 mass % or more in each part.

In the case of thermoplastic resins, whether two materials are the same or not is determined on the basis of the identicalness in terms of the structure that characterizes each thermoplastic resin. In the case of polyamide resin, for example, the determination depends on whether a resin having a repeating unit containing an amide bond accounts for 50 mass % or more of the total quantity of the components constituting the material used in both the upright wall member and the flat member. Similarly, in the case of polyester resin or polycarbonate resin or polypropylene resin, the determination depends on whether a resin having a repeating unit containing an ester bond or a resin having a repeating unit containing a carbonate bond or a resin having a repeating unit containing a propylene bond accounts for 50 mass % or more of the total quantity of the components constituting the material used in both the upright wall member and the flat member.

Specifically, polyamide 6, polyamide 11, polyamide 12, polyamide 66, polyamide 610, and polyamide 612 are all classified into the same category of a resin having a repeating unit containing an amide bond, that is, polyamide resin. Accordingly, in the case of an embodiment in which the component accounting for 50 mass % or more of the total quantity of the components constituting the upright wall member of the cover is polyamide 6 whereas the component accounting for 50 mass % or more of the total quantity of the components constituting the flat member of the cover is polyamide 66, the upright wall member of the cover and the flat member of the cover are deemed to be formed of the same material.

In the case of aluminum alloys, furthermore, whether or not the upright wall member of the cover and the flat member of the cover are formed of the same material is determined on the basis of whether aluminum accounts for 50 mass % or more of the total quantity of both the upright wall member of the cover and the flat member of the cover. For example, A2017, A4043, A5052, A6063, A7075, etc. are all classified into the same material category (aluminum alloy).

In the case of fiber reinforced resins containing reinforcement fibers or materials containing an add-in components, however, such reinforcement fibers and add-in components are excluded when determining whether or not the parts are formed of the same material.

Figure 4:
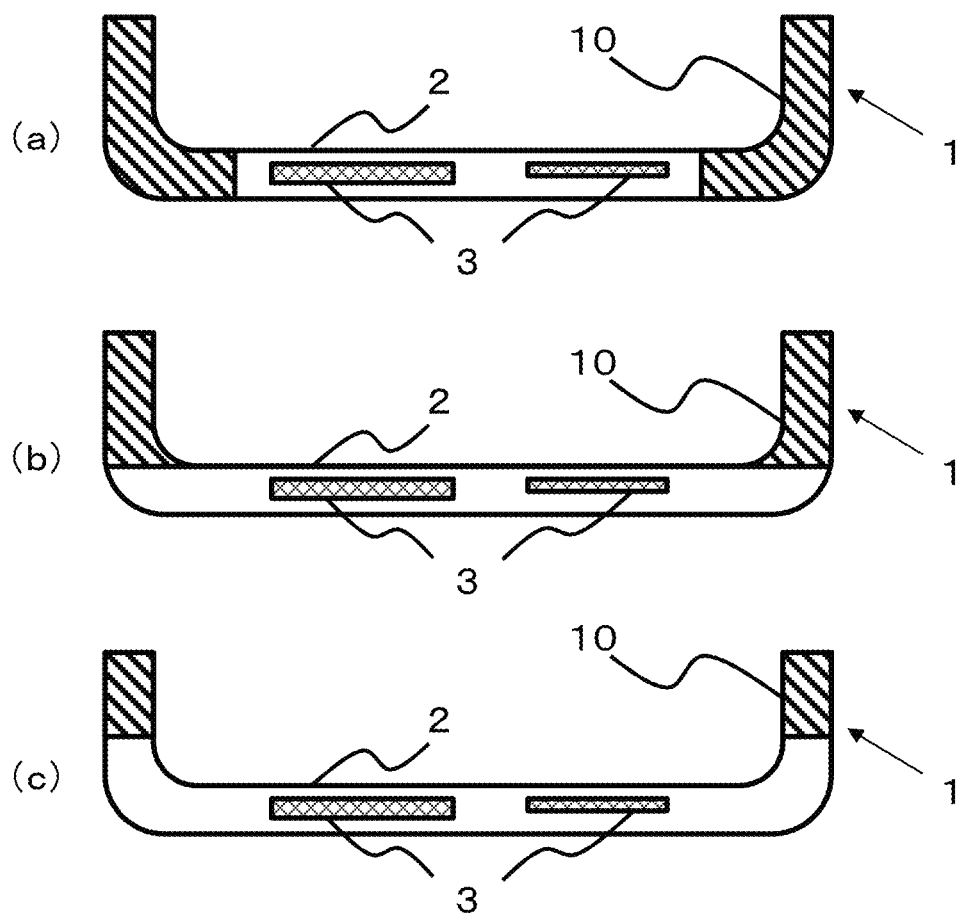
FIG. 4 is a schematic cross-sectional view illustrating the case according to the present invention in which the cover and the other members are joined and integrated.

If the upright wall member of the cover and the flat member of the cover are formed of the same material, they can be joined and integrated easily without using adhesives by such techniques as insert or outsert injection molding or ultrasonic welding. Furthermore, the case may be a combination of a cover (flat member) and another member (upright wall member) that are joined together and integrated as illustrated in FIGS. 4 (*a*) and (*b*) or the case may be a combination of a cover that constitutes the flat member and part of the upright wall member and that is joined and integrated with another member as illustrated in FIG. 4 (*c*). In particular, when the cover contains an inserted electronic device and forms a shape that includes a flat member, upright wall member, and other members necessary for the case as illustrated in FIG. 1, a high productivity will be ensured because it eliminates the necessity for the undermentioned step for forming a case by joining and integrating the cover with other members by a molding process. This is preferable also because no joints exist, leading to a case with an improved rigidity.

<Case>

It is preferable that the case according to the present invention has a space in which an electronic component is to be disposed. Having such a shape as described above, the case can work suitably to contain electric/electronic apparatuses, home appliances, and medical instruments having electronic components such as displays, batteries, and cooling fans. It is particularly preferred for clamshell type personal computers, tablet type personal computers, portable telephones, and medical cassettes.

There are no specific limitations on the method to obtain the case according to the present invention, and good ones include a method in which a cover containing an inserted electronic device is fixed in a die and subjected to insert or outsert injection molding and a method in which a preform consisting of a cover containing an inserted electronic device and other members are subjected to press molding.

<Method for Production of Case>

The case according to the present invention, which comprises a cover having an electronic device in such a manner that the electronic device is inserted in the cover can be produced by a production method that has a production process comprising: a step in which an electronic device and at least one material selected from the group consisting of prepreg, film, and nonwoven fabric are stacked in such a manner that the electronic device is located on the inner side to form a preform and a step in which compression and/or reduced pressure is applied to shape the preform. In this way, the case can be produced easily from a preform that is prepared in advance by fixing an electronic device inside the material to be used to form the case. It is preferable to adopt a preform that is prepared by using a die employed in the shaping step because it prevents the position of the electronic device from shifting during the conveyance of the preform. The adoption of a step for shaping the preform under compression and/or reduced pressure serves to produce a case containing less voids (fine gaps).

Furthermore, the adoption of appropriately selected various materials for lamination in the preform preparation process makes it possible to produce a case in which an electrically conductive material and a nonconductive material are disposed at least as part of the cover.

EXAMPLES

The present invention is described in more detail below with reference to examples. First, the materials used for the present invention are described below.

<Materials Used>

[Material 1]

Glass cloth formed of glass fiber with a weight per unit area of 200 g/m$^2$ and a two-component epoxy resin composed of a base resin and a curing agent were prepared and the glass cloth was impregnated with the epoxy resin in such a manner that the content by mass (Wf) of the glass fiber reached 50% to provide material 1.

[Material 2]

Except for using carbon fiber cloth formed of carbon fiber with a weight per unit area of 198 g/m$^2$, the same procedure as in Example 1 was carried out to impregnate the carbon fiber cloth with the epoxy resin to provide material 2.

Example 1

Figure 5:
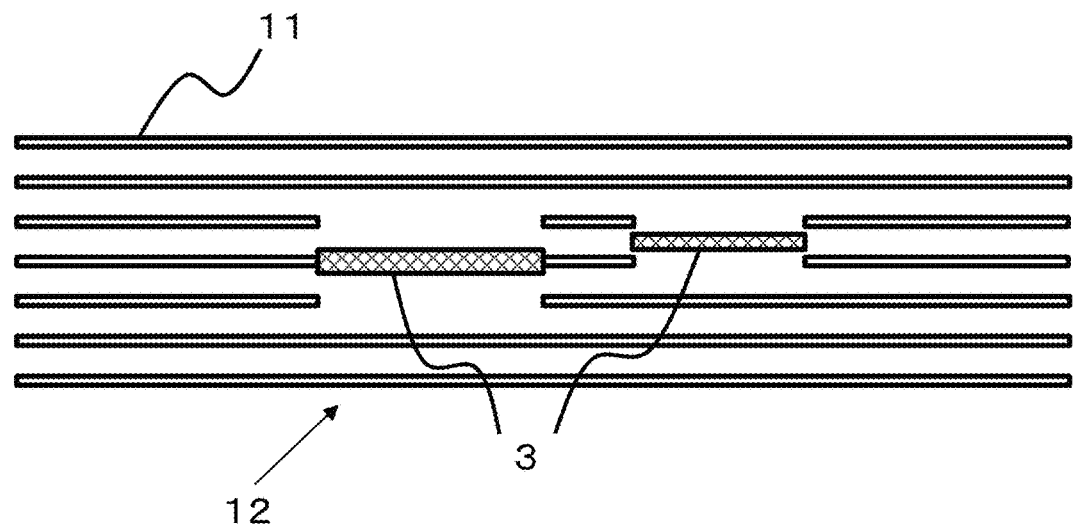
FIG. 5 is a schematic cross-sectional view illustrating the preform used in Example 1 of the present invention.

An IC chip with a thickness of 0.7 mm and a resistor with a thickness of 0.5 mm were adopted as electronic devices and layers of material 1 were stacked together therewith to provide preform 1 as illustrated in FIG. 5. The resulting preform 1 was fixed in a die adjusted to a temperature of 50° C. and subjected to compression and hot pressing. Two hours later, the die was opened to obtain case 1.

Example 2

Figure 6:
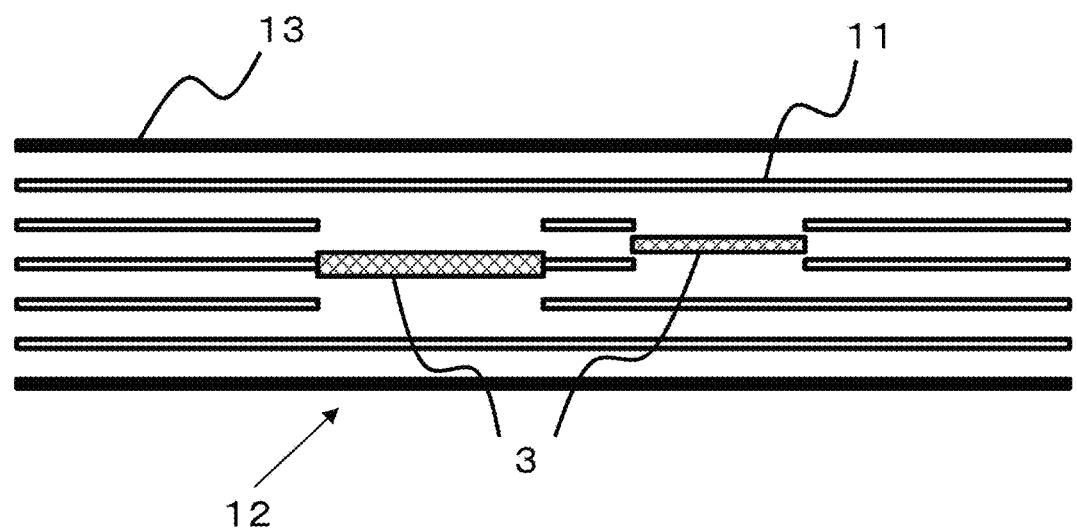
FIG. 6 is a schematic cross-sectional view illustrating the preform used in Example 2 of the present invention.

An IC chip with a thickness of 0.7 mm and a resistor with a thickness of 0.5 mm were adopted as electronic devices and layers of material 1 and material 2 were stacked together therewith to provide preform 2 as illustrated in FIG. 6. Except for using the resulting preform 2, the same procedure as in Example 1 was carried out to produce case 2.

Example 3

Figure 7:
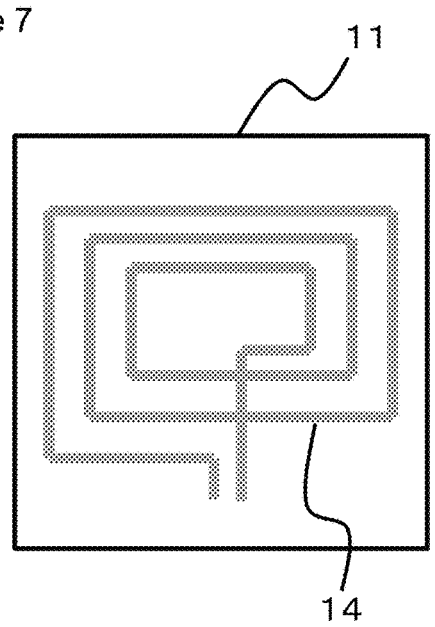
FIG. 7 is a schematic view illustrating a state in which a circuit is printed directly on a prepreg used in Example 3 of the present invention.
Figure 7:
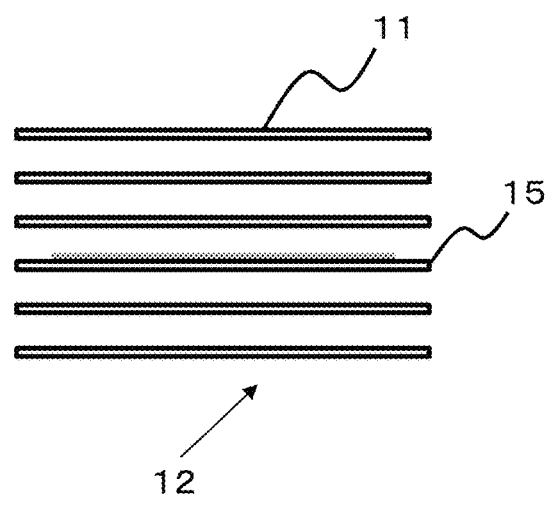

A prepreg as illustrated in FIG. 7 (a) was prepared by printing a circuit directly on the surface thereof using an electrically conductive paste and lamination was performed to provide preform 3 as illustrated in FIG. 7 (b). Except this, the same procedure as in Example 1 was carried out to produce case 3.

Example 4

Cover 4, which has a flat member as illustrated in FIG. 4 (a), was molded from preform 1, which is described in Example 1. The other member, namely, other member 4 which is the upright wall member, was molded from an Ny6 matrix resin and fiber reinforcement pellets with a carbon fiber content (Wf) of 30% (Torayca pellets TLP1060, manufactured by Toray Industries, Inc.) using an injection molding machine. The resulting cover 4 and other member 4 were joined with an adhesive to produce case 4.

The case produced in each Example does not require the formation of bosses or ribs used to arrange electronic devices as in the case of prior art, and it is not necessary to mount electronic devices in the interior of the case, making it possible to provide a case with a high storage capacity because the entire space inside the case can be used to arrange electronic components. In Example 1, the cover and case were formed only of a glass fiber reinforced resin that was a nonconductive material, and therefore, they were high in radio wave permeability. The cover and case prepared in Example 2 contained a carbon fiber reinforced resin, which was an electrically conductive material, at the surfaces thereof, and accordingly, the case had a high shieldability to the electromagnetic waves coming from the electronic devices inserted in the cover. Thus, its potential applications range over a wide spectrum including cases for electric and electronic devices, office automation instruments, household electrical appliances, medical instruments, etc., as well carrying cases for transportation. Free of the necessity for substrates for electronic device fabrication, the case obtained in Example 3 had the feature of being small in weight. In the case of the case obtained in Example 4, the cover that contained insert electronic devices formed only the flat member of a simple shape and the other members such as the upright wall of a complicated shape were formed of an injection molding material with a high moldability, allowing the case to have a high degree of design freedom.

INDUSTRIAL APPLICABILITY

The present invention provides preferable potential applications ranging over a wide spectrum including cases for electric and electronic devices, office automation instruments, household electrical appliances, medical instruments, etc., as well as carrying cases for transportation.

EXPLANATION OF NUMERALS 1. case
2. cover
3. electronic device
4. the inner space of the cover
5. the inner space of the case
6. electrically conductive material
7. nonconductive material
8. mechanism for connection with electronic device
9. battery 10. other member
11. material 1 (glass fiber reinforced resin)
12. preform
13. material 2 (carbon fiber reinforced resin)
14. circuit
15. prepreg having printed circuit

The invention claimed is:

1. A case comprising a cover and an electronic device disposed within a portion of the cover, wherein
the cover comprises both multiple stacked layers of a fiber-reinforced conductive thermosetting resin and multiple stacked layers of a fiber-reinforced nonconductive thermosetting resin so as to form a prepreg, wherein at least a portion of one or more layers is absent so as to form an inner space that includes an interior portion of the prepreg, and the layers of the fiber-reinforced conductive thermosetting resin are disposed in an outer portion of the cover, while the layers of the fiber-reinforced nonconductive thermosetting resin are disposed in an inner portion of the cover,
the electronic device is a device that functions as a component for a computer or cell phone and is disposed within the inner space of the prepreg so as to form a preform, and
the preform is subjected to compression and/or reduced pressure which shapes the preform and forms the case.

2. The case as set forth in claim 1, wherein
the cover comprises at least a flat member and
the electronic device is inserted inside an inner space within the flat member of the cover.

3. The case as set forth in claim 1, wherein the conductive thermosetting resin is reinforced with carbon or metal fiber.

4. The case as set forth in claim 1, wherein the nonconductive thermosetting resin is reinforced with glass or aramid fiber.

5. The case as set forth in claim 1, wherein the cover further comprises a mechanism connectable to the electronic device.

6. The case as set forth in claim 2, wherein an upright wall member of the cover is made of the same material as the flat member of the cover.

* * * * *